United States Patent [19]

Fritzinger et al.

[11] Patent Number: 5,002,898
[45] Date of Patent: Mar. 26, 1991

[54] INTEGRATED-CIRCUIT DEVICE ISOLATION

[75] Inventors: Larry B. Fritzinger, Bethlehem; Kuo-Hua Lee, Lower Macungie Township, Lehigh County; Chih-Yuan Lu, Lower Macungie Township, Lehigh County; Janmye Sung, Lower Macungie Township, Lehigh County, all of Pa.

[73] Assignee: AT&T Bell Laboratories, Murray Hill, N.J.

[21] Appl. No.: 423,992

[22] Filed: Oct. 19, 1989

[51] Int. Cl.$^5$ ............................................. H01L 217/6
[52] U.S. Cl. ............................................. 437/69; 437/72
[58] Field of Search ....................... 437/69, 70, 72, 61

[56] References Cited

U.S. PATENT DOCUMENTS

| | | | |
|---|---|---|---|
| 4,407,696 | 10/1983 | Han et al. | 437/69 |
| 4,541,167 | 9/1985 | Havemann et al. | 29/576 |
| 4,630,356 | 12/1986 | Christie et al. | 437/69 |
| 4,746,625 | 5/1988 | Morita et al. | 437/63 |

FOREIGN PATENT DOCUMENTS

| | | | |
|---|---|---|---|
| 0146895 | 7/1985 | European Pat. Off. | 437/70 |
| 0076856 | 5/1982 | Japan | 437/69 |
| 0137457 | 6/1988 | Japan | 437/70 |

OTHER PUBLICATIONS

N. Hoshi et al., "An Improved LOCOS Technology Using Thin Oxide and Polysilicon Buffer Layers", Journal of the Electrochemical Society of Japan, vol. 98 (1984), pp. 78-83.

Primary Examiner—Olik Chaudhuri
Assistant Examiner—George Fourson
Attorney, Agent, or Firm—R. D. Laumann

[57] ABSTRACT

In the manufacture of integrated-circuit semiconductor devices, prior to formation of a field oxide, a mask structure is provided on a silicon device area, comprising a pad oxide layer, a polysilicon buffer layer, a protective oxide layer, and a silicon nitride mask layer. Inclusion of the protective layer between polysilicon and silicon nitride layers prevents pad oxide failure and attendant substrate etching during strip-etching of the structure overlying the pad oxide.

11 Claims, 1 Drawing Sheet

INTEGRATED-CIRCUIT DEVICE ISOLATION

TECHNICAL FIELD

The invention is concerned with the manufacture of integrated-circuit semiconductor devices.

BACKGROUND OF THE INVENTION

In the manufacture of integrated-circuit semiconductor device chips including device structures such as, e.g., field-effect or bipolar transistors, individual device structures are typically separated and electrically isolated by a so-called field oxide which is produced by locally oxidizing a silicon surface portion. For this purpose, localized oxidation may be effected by exposure of a wafer substrate to an oxidizing atmosphere under pressure, while device areas to be protected from oxidation are covered by a layer of a suitable masking material such as silicon nitride. Refinements of this technique include an additional thin layer of silicon oxide, known as pad oxide between the substrate and the silicon nitride layer, such inclusion being motivated in the interest of stress relief. Furthermore, in the interest of minimizing an undersirable "bird-beak" formation at the edge of the field oxide, inclusion of a third layer between the silicon oxide and the silicon nitride has been proposed, consisting of polycrystalline silicon as disclosed, e.g., in U.S. Pat. No. 4,541,167, issued Sept. 17, 1985 to R. H. Havemann et al., and in the paper by N. Hoshi et al., "An Improved LOCOS Technology Using Thin Oxide and Polysilicon Buffer Layers", *Journal of the Electrochemical Society of Japan*, Vol. 98 (1984), pp. 78–83.

Typically, after forming of the field oxide in the presence of a mask structure as described above, it is desired to strip-etch the silicon nitride and polysilicon layers of the mask structure, with phosphoric-acid wet etching being used for silicon nitride, and plasma etching for polysilicon—while the silicon substrate remains protected by the pad oxide. It has been observed, however, that such protection may fail especially in the vicinity of the field oxide, and that the substrate may undergo ruinous etching there. The invention described below is motivated by the desire to prevent such etching of the substrate in the course of stripping of silicon nitride and polysilicon.

SUMMARY OF THE INVENTION

Prior to formation of a field oxide, a mask structure is provided on a silicon device area, comprising a pad oxide layer, a silicon buffer layer, a protective oxide layer, and a silicon nitride mask layer. Inclusion of the protective layer between silicon and silicon nitride layers was found to inhibit pad oxide failure and attendant substrate etching in the course of strip-etching of the structure overlying the pad oxide after field-oxide formation.

DETAILED DESCRIPTION

Figure 1:
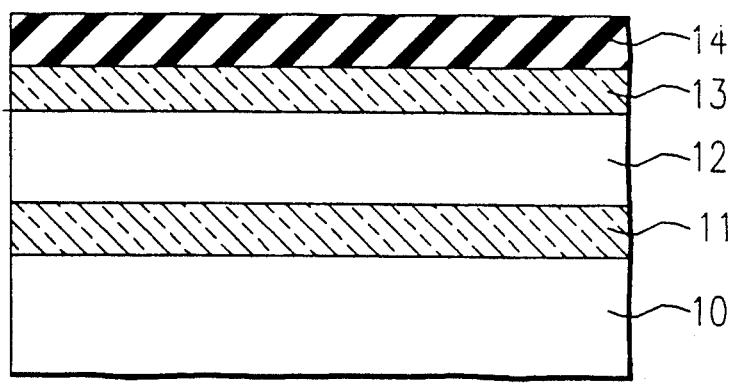
FIGS. 1–4 are schematic cross-sectional views of a portion of a semiconductor structure at sequential stages of exemplary processing in accordance with a preferred embodiment of the invention.

Structural features shown in FIGS. 1–4 include silicon substrate 10 (optionally comprising a surface epitaxial layer), pad oxide/field oxide layer 11, (poly-)silicon buffer layer 12, silicon oxide protective layer 13, and silicon nitride oxidation mask layer 14.

FIG. 1 shows an initial structure as produced by sequential processing, starting with substrate 10, and including thermal growth of pad oxide layer 11 with thickness in a preferred range from 50 to 200 angstroms (nominal thickness 100 angstroms); deposition of polysilicon layer 12, e.g., by low-pressure chemical vapor deposition (LPCVD), with thickness in a preferred range from 300 to 800 angstroms (nominal thickness 600 angstroms; thermal growth of silicon oxide layer 13 with thickness in a preferred range from 30 to 100 angstroms (nominal thickness 50 angstroms); and deposition of silicon nitride layer 14, e.g., by low-pressure chemical vapor deposition, with thickness in a preferred range from 1700 to 3000 angstroms (nominal thickness 2400 angstroms).

While thermal growth is preferred for silicon oxide layers 11 and 13, e.g., by exposure to dry oxygen at a temperature of 800 degrees C. for 20 to 30 minutes, use of deposition methods is not precluded. Such deposition may involve the use of reagents such as, e.g., silane, diethylsilane, tetraethylorthosilicate (TEOS), tetramethylcycloetrasiloxane (TMCTS), diacetoxyditeriarybutoxysilane (DADBS), diacetoxydiisopropoxysilane (DADIS), or tritertiarybutoxyethoxysilane (TBES). It is noted, furthermore, that buffer layer 12 may have essentially amorphous structure upon deposition. However, such structure tends to become distinctly polycrystalline upon further processing, and especially upon deposition of layer 14.

With respect to the chemical composition of layers 11–14, no high-purity requirements are imposed, and semiconductor quality is considered sufficient. With respect to stoichiometry, $Si_3N_4$ is preferred as an oxidation-mask material, and $SiO_2$ as pad-oxide, and protective-layer material, different stoichiometries not being precluded as may result, e.g., depending on deposition methods used.

Figure 2:
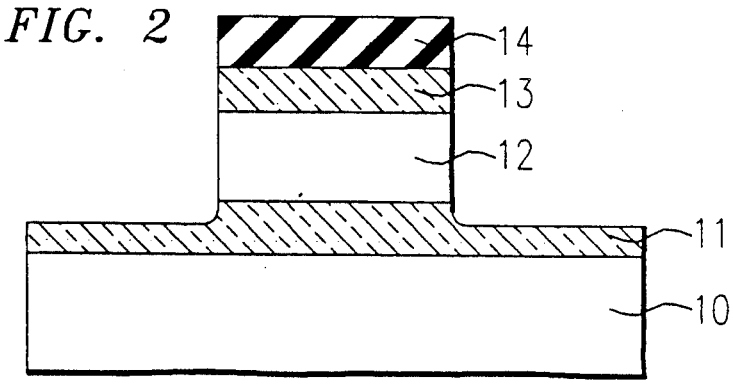

FIG. 2 shows the structure of FIG. 1 after further processing including pattern etching to define a region to be protected during field-oxide formation, such region typically being termed active region, device region, or device-active region. Patterning typically involves deposition of a photoresist layer, photographic exposure, development of the exposed pattern, and transfer of the developed pattern into underlying layers 14, 13, and 12 by anisotropic etching in a suitable plasma: layers 14 and 13 may be etched, e.g., in a plasma of oxygen and Freon 23 (as obtainable from the DuPont company), and layer 12 in a chlorine-oxygen plasma.

Optionally at this point, and typically prior to stripping of the resist layer, a step of ion implanting may be used for p- or n- type conductivity of the substrate.

Figure 3:
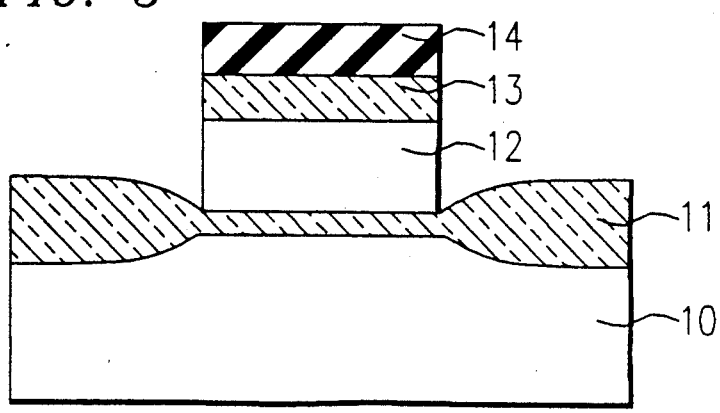

FIG. 3 shows the structure of FIG. 2 after further processing including field oxide formation, typically by exposure to steam under pressure.

Figure 4:
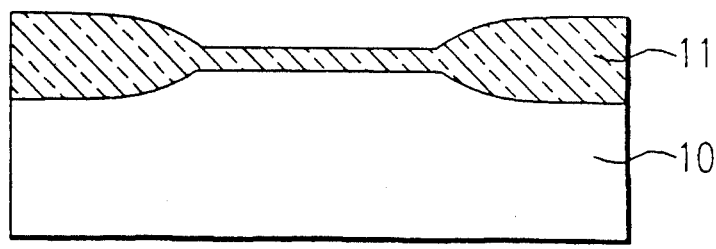

FIG. 4 shows the structure of FIG. 3 after stripping of layers 12, 13, and 14 from the device region, leaving a surface oxide layer 11 comprising pad and field oxides. Preferred processing in accordance with the invention involves stripping by wet etching of layer 14 by means of hot phosphoric acid, followed by plasma etching of protective layer 13 as well as of buffer layer 12. Alternatively, layers 13 and 14 may be removed by wet etching, e.g., with dilute or buffered hydrofluoric acid being used or layer 13, and a potassium-hydroxide solution for layer 12. Yet another possibility involves oxidation of buffer layer 12, followed by stripping of the oxidized layer in dilute or buffered hydrofluoric acid.

It is during stripping of the mask structure overlying the pad oxide that a principal benefit of preferred processing of the invention is realized, namely prevention of accidental etching of the substrate. Such prevention may be understood in terms of the following interpretation:

During phosphoric-acid wet etching of layer 14, in the case of a prior-art structure not including protective layer 13, the etchant attacks not only silicon nitride but also underlying polysilicon—especially in the vicinity of the field oxide where the polysilicon layer tends to be weakened due to stress especially at polysilicon grain boundaries. The resulting unevenness of the polysilicon layer tends to be reproduced, during plasma strip-etching, in the underlying pad oxide layer 11, resulting in local weakening and even perforation of the pad oxide. Upon such perforation, the substrate will be attached by the layer-12 etchant.

By contrast, in the presence of protective layer 13, wet etching of silicon nitride layer 14 does not affect silicon layer 12, and the uniformity and integrity of layer 12 is preserved. As a result, plasma etching of layer 12 does not lead to localized failure of the layer 11, and substrate etching is prevented.

At this point the structure is ready for further device processing, including, e.g., stripping of the pad oxide and forming of a field-effect gate structure as used in metal-oxide-semiconductor field-effect transistor (MOSFET) or complementary metal-oxide-semiconductor (CMOS) structures. Preferred processing in accordance with the invention may also be used in the manufacture of bipolar devices.

We claim:

1. In the manufacture of integrated-circuit semiconductor devices, a method for forming an isolation region on a portion of a planar silicon surface, comprising
   forming an oxidation mask structure on a first oxide layer on said surface, said structure covering a device region excluded from said planar portion and comprising a buffer layer consisting essentially of silicon, and a mask layer consisting essentially of silicon nitride,
   forming said isolation region by oxidation of said portion of said planar silicon surface, and
   removing said structure from said device region by etching,
   characterized in that, intermediary to said buffer layer and said mask layer a second oxide layer is included, consisting essentially of silicon oxide, whereby, in the course of removing said structure, etching of the surface is inhibited.

2. The method of claim 1 in which removing said structure comprises wet etching of said mask layer.

3. The method of claim 2 in which wet etching comprises exposure to phosphoric acid.

4. The method of claim 1 in which removing said structure comprises plasma etching of said buffer layer.

5. The method of claim 4 in which plasma etching comprises exposure to a chlorine-oxygen plasma.

6. The method of claim 1 in which said second oxide layer is formed by thermal growth.

7. The method of claim 1 in which said second oxide layer is formed by deposition.

8. The method of claim 1 in which said first oxide layer is formed by thermal growth.

9. The method of claim 1 in which said oxidation mask structure is anisotropically etched in the presence of a photolithographically patterned resist layer.

10. The method of claim 9 in which anisotropic etching comprises exposure of said mask layer to a plasma comprising Freon 23 and oxygen.

11. The method of claim 9 in which anisotropic etching comprises exposure of said buffer layer to a plasma comprising chlorine and oxygen.

* * * * *